(12) United States Patent
Abatchev et al.

(10) Patent No.: US 9,941,123 B1
(45) Date of Patent: Apr. 10, 2018

(54) POST ETCH TREATMENT TO PREVENT PATTERN COLLAPSE

(71) Applicant: Lam Research Corporation, Fremont, CA (US)

(72) Inventors: Mirzafer Abatchev, Fremont, CA (US); Qian Fu, Pleasanton, CA (US); Yasushi Ishikawa, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/483,662

(22) Filed: Apr. 10, 2017

(51) Int. Cl.
*H01L 21/311* (2006.01)
*H01L 21/033* (2006.01)

(52) U.S. Cl.
CPC ...... *H01L 21/0337* (2013.01); *H01L 21/0332* (2013.01); *H01L 21/0335* (2013.01)

(58) Field of Classification Search
USPC .......................................................... 438/695
See application file for complete search history.

(56) References Cited

U.S. PATENT DOCUMENTS

| 6,528,432 B1 | 3/2003 | Ngo et al. |
| 6,849,389 B2 | 2/2005 | Mahorowala |
| 9,583,337 B2 | 2/2017 | Zafiropoulo |
| 2013/0109188 A1* | 5/2013 | Kim .................. H01L 21/31122 438/710 |
| 2015/0064880 A1 | 3/2015 | Kim et al. |

FOREIGN PATENT DOCUMENTS

WO  2011/042882  4/2011

OTHER PUBLICATIONS

Hutton et al. "Plasma development of a silylated bilayer resist: Effects of etch chemistry on critical dimension control and feature profiles", Journal of Vacuum Science & Technology B, 1995.
Mori et al. "Pattern collapse in the top surface imaging process after dry development", Journal of Vacuum Science & Technology B: Microelectronics and Nanometer Structures Processing Measurement, and Phenomena, 1998.
Pons et al. "Anisotropic etching of polymers in S02/O2 plasmas: Hypotheses on surface mechanisms", Journal of Applied Physics, vol. 75, Issue 9, 1994.

* cited by examiner

*Primary Examiner* — Roberts Culbert
(74) *Attorney, Agent, or Firm* — Beyer Law Group LLP

(57) ABSTRACT

A method for etching features in a stack comprising a patterned hardmask over a carbon based mask layer is provided. A pattern is transferred from the patterned hardmask to the carbon based mask layer, comprising providing a flow of a transfer gas comprising an oxygen containing component and at least one of $SO_2$ or COS, forming the transfer gas into a plasma, providing a bias of greater than 10 volts, and stopping the flow of the transfer gas. A post treatment is provided, comprising providing a flow of a post treatment gas comprising at least one of He, Ar, $N_2$, $H_2$, or $NH_3$, wherein the flow is provided to maintain a processing pressure of between 50 mTorr and 500 mTorr inclusive, forming the post treatment gas into a plasma, providing a bias of greater than 20 volts, and stopping the flow of the post treatment gas.

18 Claims, 5 Drawing Sheets

POST ETCH TREATMENT TO PREVENT PATTERN COLLAPSE

BACKGROUND

The disclosure relates to a method of forming semiconductor devices on a semiconductor wafer. More specifically, the disclosure relates to etching features using a patterned hardmask over a carbon based mask layer.

In forming semiconductor devices, etch layers may be etched using multilayered masks, such as a hardmask layer over a carbon based mask layer.

SUMMARY

To achieve the foregoing and in accordance with the purpose of the present disclosure, a method for etching features in a stack comprising a patterned hardmask over a carbon based mask layer over an etch layer is provided. A pattern is transferred from the patterned hardmask to the carbon based mask layer, comprising providing a flow of a transfer gas comprising an oxygen containing component and at least one of $SO_2$ or COS, forming the transfer gas into a plasma, providing a bias of greater than 10 volts to accelerate ions from the plasma to the carbon based mask layer, which transfers the pattern to the carbon based mask layer, and stopping the flow of the transfer gas. A post treatment is provided, comprising providing a flow of a post treatment gas comprising at least one of He, Ar, $N_2$, $H_2$, or $NH_3$, wherein the flow is provided to maintain a processing pressure of between 50 mTorr and 500 mTorr inclusive, forming the post treatment gas into a plasma, providing a bias of greater than 20 volts to accelerate ions from the plasma to the carbon based mask layer, and stopping the flow of the post treatment gas.

These and other features of the present invention will be described in more details below in the detailed description of the invention and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
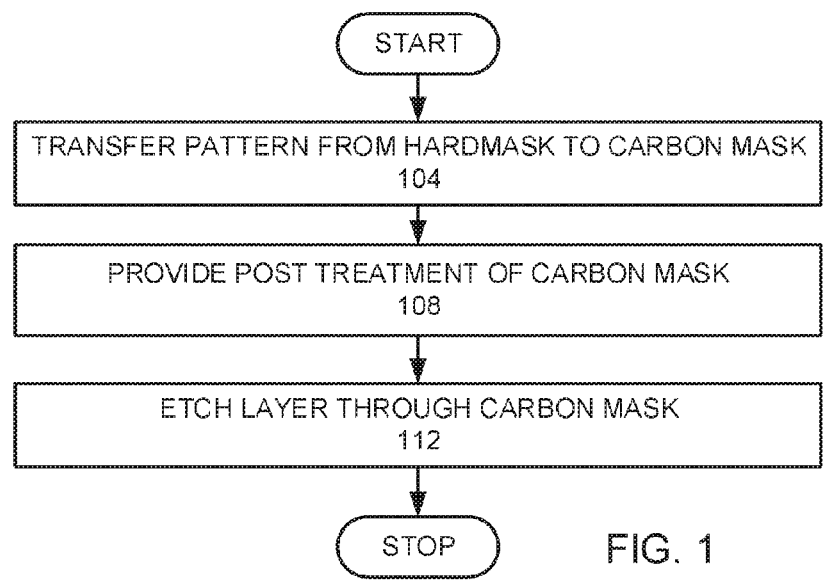
FIG. 1 is a high level flow chart of an embodiment.
Figure 2:
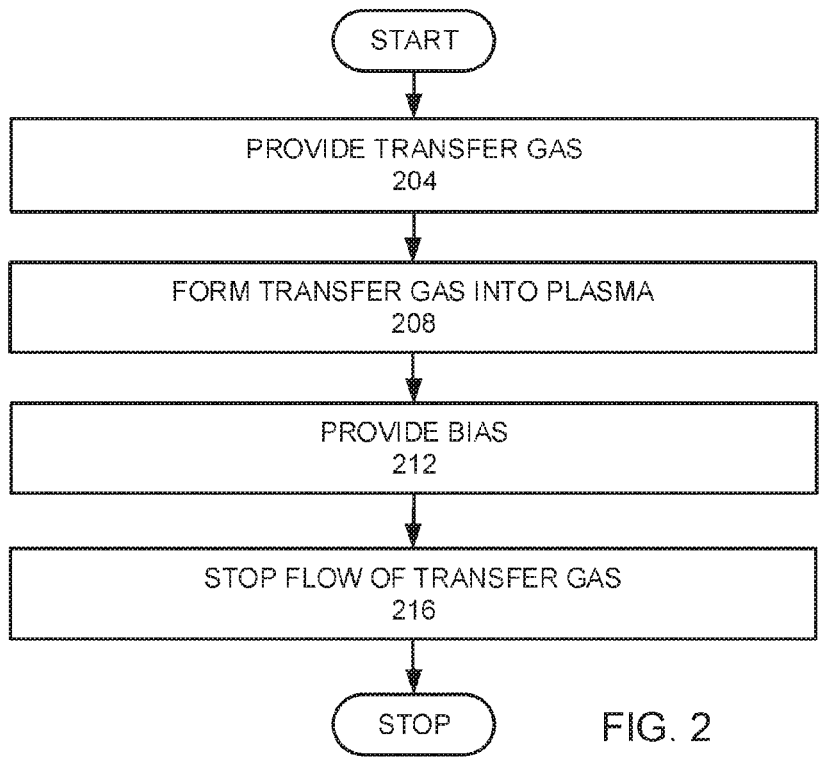
FIG. 2 is a more detailed flow chart of a step of transferring a pattern from a patterned hardmask to a carbon containing layer.
Figure 3:
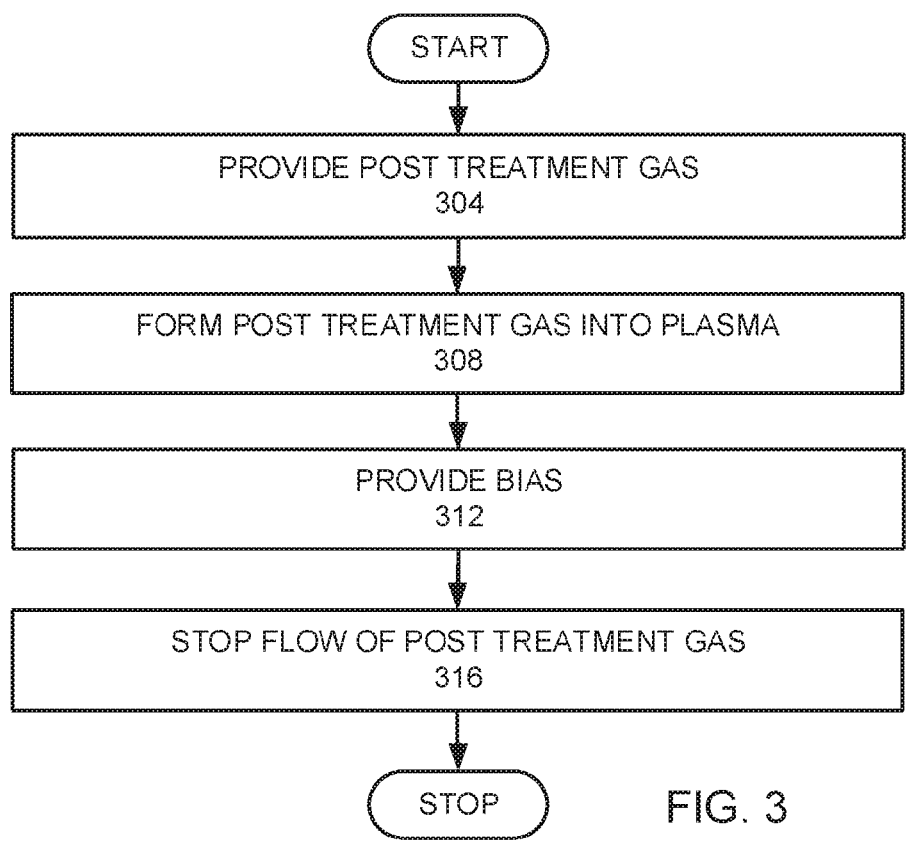
FIG. 3 is a more detailed flow chart of a step of providing a post treatment.

FIG. 1 is a high level flow chart of an embodiment. In this embodiment, a pattern is transferred from a patterned hardmask to a carbon containing mask layer (step 104). A post treatment is provided (step 108). An etch layer is etched through the carbon containing mask layer (step 112). FIG. 2 is a more detailed flow chart of the step of transferring the pattern from the patterned hardmask to the carbon containing layer (step 104). A transfer gas comprising at least one oxygen containing component and at least one of $SO_2$ or COS is provided (step 204). The transfer gas is formed into a plasma (step 208). A bias is provided (step 212). The flow of the transfer gas is stopped (step 216). FIG. 3 is a more detailed flow chart of the step of providing a post treatment (step 108). A post treatment gas is provided at a pressure between 50 mTorr and 500 mTorr inclusive (step 304). The post treatment gas is formed into a plasma (step 308). A bias is provided (step 312). The flow of the post treatment gas is stopped (step 316).

EXAMPLE

Figure 4A:
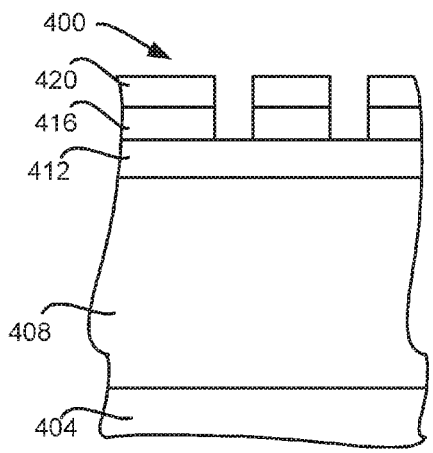
FIGS. 4A-D are schematic cross-sectional views of a stack processed according to an embodiment.

In a preferred embodiment of the invention, a pattern is transferred from a patterned hardmask to a carbon containing mask layer (step 104). FIG. 4A is a schematic cross-sectional view of a stack 400 with a substrate 404 with an etch layer 408 disposed below a carbon based mask layer 412, which is disposed below a patterned hardmask 416, which is disposed below a photoresist mask 420. In this example, the etch layer 408 is Si. In other embodiments, the etch layer may be other materials, such as Si, $SiO_2$, $Si_3N_4$, tungsten, tungsten nitride, titanium, titanium nitride, aluminum oxide, or hafnium oxide. In this example, the carbon based hardmask 412 is amorphous carbon. The patterned hardmask 416 is silicon nitride or silicon oxynitride. In this example, one or more layers may be disposed between the substrate 404 and the etch layer 408, or between the etch layer 408 and the carbon based mask layer 412, or between the carbon based mask layer 412 and the patterned hardmask 416 or between the patterned hardmask 416 and the photoresist mask 420. The photoresist mask 420 is used to pattern the patterned hardmask 416.

Figure 5:
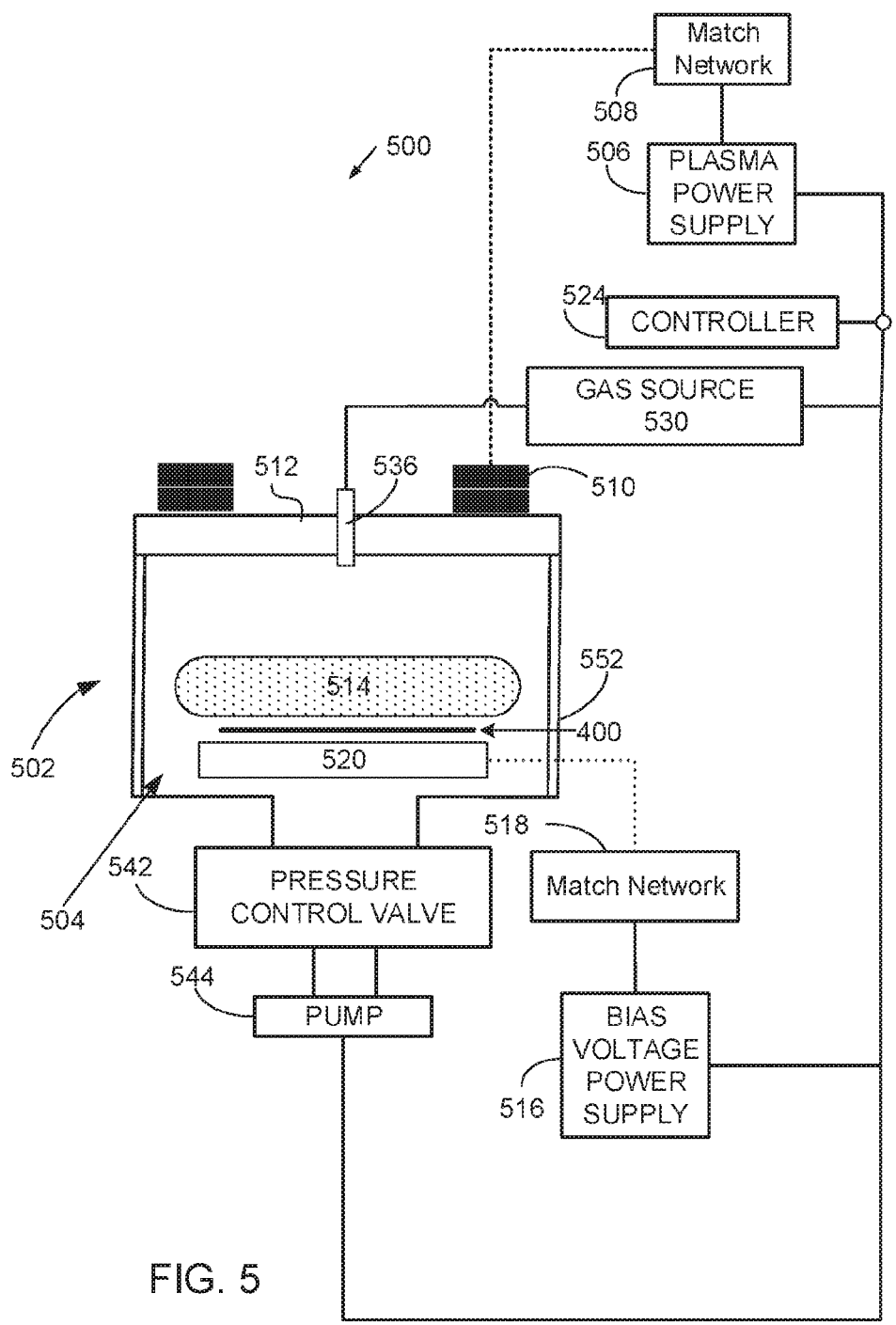
FIG. 5 is a schematic view of a plasma processing chamber that may be used in an embodiment.

A pattern is transferred from the patterned hardmask 416 to the carbon based mask layer (step 104). To provide the pattern transfer, the stack 400 is placed in a plasma processing chamber. FIG. 5 schematically illustrates an example of a plasma processing system 500 which may be used to process the stack 400 in accordance with one embodiment of the present invention. The plasma processing system 500 includes a plasma reactor 502 having a plasma processing chamber 504, enclosed by a chamber wall 552. A plasma power supply 506, tuned by a match network 508, supplies power to a TCP coil 510 located near a power window 512 to create a plasma 514 in the plasma processing chamber 504 by providing an inductively coupled power. The TCP coil (upper power source) 510 may be configured to produce a uniform diffusion profile within the plasma processing chamber 504. For example, the TCP coil 510 may be configured to generate a toroidal power distribution in the plasma 514. The power window 512 is provided to separate the TCP coil 510 from the plasma processing chamber 504 while allowing energy to pass from the TCP coil 510 to the plasma processing chamber 504. A wafer bias voltage power supply 516 tuned by a match network 518 provides power to an electrode 520 to set the bias voltage on the stack 400 which is supported over the electrode 520. A controller 524 sets points for the plasma power supply 506 and the wafer bias voltage power supply 516.

The plasma power supply 506 and the wafer bias voltage power supply 516 may be configured to operate at specific radio frequencies such as, 13.56 MHz, 27 MHz, 2 MHz, 400 kHz, or combinations thereof. Plasma power supply 506 and wafer bias voltage power supply 516 may be appropriately sized to supply a range of powers in order to achieve desired process performance. For example, in one embodiment of the present invention, the plasma power supply 506 may supply the power in a range of 50 to 5000 Watts, and the wafer bias voltage power supply 516 may supply a bias voltage of in a range of 20 to 2000 V. In addition, the TCP coil 510 and/or the electrode 520 may be comprised of two or more sub-coils or sub-electrodes, which may be powered by a single power supply or powered by multiple power supplies.

As shown in FIG. 5, the plasma processing system 500 further includes a gas source/gas supply mechanism 530. The gas source/gas supply mechanism 530 provides gas to a gas feed 536 in the form of a nozzle. The process gases and byproducts are removed from the plasma processing chamber 504 via a pressure control valve 542 and a pump 544, which also serve to maintain a particular pressure within the plasma processing chamber 504. The gas source/gas supply mechanism 530 is controlled by the controller 524. A Kiyo by Lam Research Corp. of Fremont, Calif., may be used to practice an embodiment of the invention. In various embodiments, the process chamber can be a CCP (capacitive coupled plasma) reactor or an ICP (inductive coupled plasma) reactor.

Figure 6:
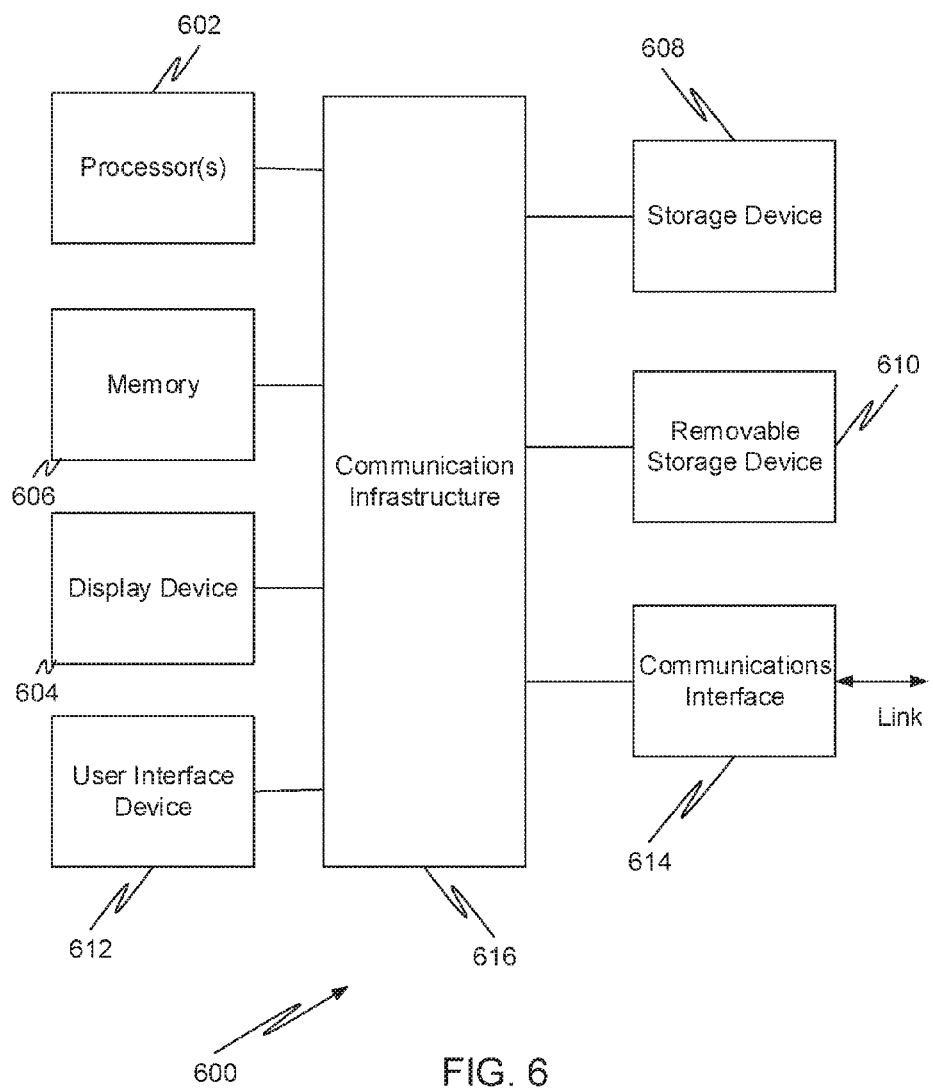
FIG. 6 is a schematic view of a computer system that may be used in practicing an embodiment.

FIG. 6 is a high level block diagram showing a computer system 600, which is suitable for implementing a controller 524 used in embodiments of the present invention. The computer system may have many physical forms ranging from an integrated circuit, a printed circuit board, and a small handheld device, up to a huge super computer. The computer system 600 includes one or more processors 602, and further can include an electronic display device 604 (for displaying graphics, text, and other data), a main memory 606 (e.g., random access memory (RAM)), storage device 608 (e.g., hard disk drive), removable storage device 610 (e.g., optical disk drive), user interface devices 612 (e.g., keyboards, touch screens, keypads, mice or other pointing devices, etc.), and a communication interface 614 (e.g., wireless network interface). The communication interface 614 allows software and data to be transferred between the computer system 600 and external devices via a link. The system may also include a communications infrastructure 616 (e.g., a communications bus, cross-over bar, or network) to which the aforementioned devices/modules are connected.

Information transferred via communications interface 614 may be in the form of signals such as electronic, electromagnetic, optical, or other signals capable of being received by communications interface 614, via a communication link that carries signals and may be implemented using wire or cable, fiber optics, a phone line, a cellular phone link, a radio frequency link, and/or other communication channels. With such a communications interface, it is contemplated that the one or more processors 602 might receive information from a network, or might output information to the network in the course of performing the above-described method steps. Furthermore, method embodiments of the present invention may execute solely upon the processors or may execute over a network such as the Internet in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

FIG. 2 is a more detailed flow chart of the step of transferring the pattern from the patterned hardmask to the carbon containing layer (step 104). A transfer gas comprising at least one oxygen containing component and at least one of $SO_2$ or COS is provided (step 204). In this example, the transfer gas comprises 80 sccm $O_2$ and 90 sccm $SO_2$ at pressure of 8 mTorr. The transfer gas is formed into a plasma (step 208). In this example, 800 Watts is provided by the coil at 13.56 MHz by the TCP coil 510. A bias is provided (step 212). A bias of 350 volts is provided by the bias voltage power supply 516. The flow of the transfer gas is stopped (step 216). In this example, the process is stopped after reaching OES endpoint+30% overetch.

Figure 4B:
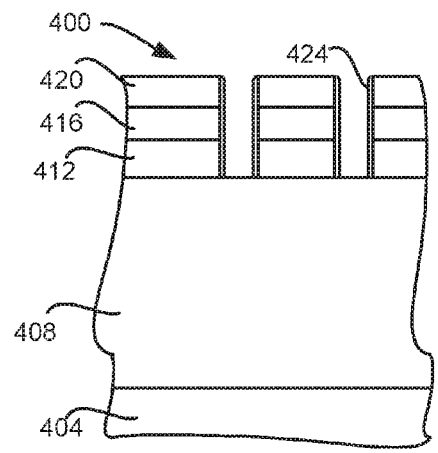

FIG. 4B is a schematic cross-sectional view of a stack 400 after the pattern has been transferred to the carbon based mask layer 412. The pattern transfer process forms a sulfur containing sidewall passivation 424.

A post etch treatment is provided (step 108). FIG. 3 is a more detailed flow chart of the step of providing a post treatment (step 108). A post treatment gas is provided comprising at least one of He, Ar, $N_2$, $H_2$, or $NH_3$ at a pressure between 50 mTorr and 500 mTorr inclusive (step 304). In this example, the post treatment gas is 400 sccm He and 10 sccm $N_2$ provided at a pressure of 250 mTorr. The post treatment gas is formed into a plasma (step 308). In this example, 2500 Watts is provided by the coil at 13.56 MHz by the TCP coil 510. A bias is provided (step 312). A bias of 20 volts is provided by the bias voltage power supply 516. The flow of the post treatment gas is stopped (step 316). In this example, the process is stopped after 20 seconds.

Figure 4C:
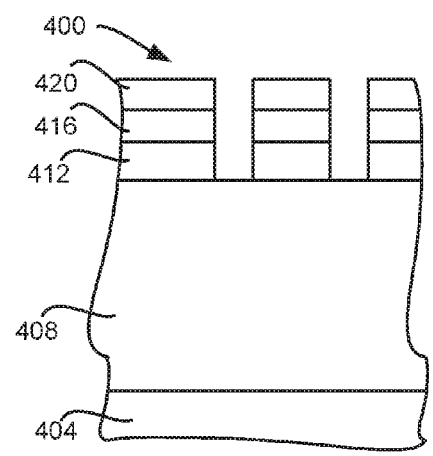

FIG. 4C is a schematic cross-sectional view of a stack 400 after the post etch treatment. The post etch treatment removes the sulfur containing sidewall passivation.

Figure 4D:
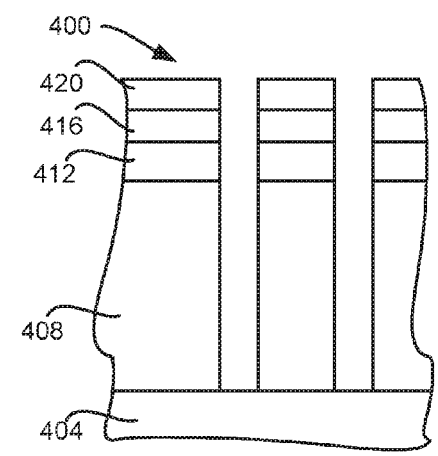

The etch layer 408 is etched through the carbon containing mask layer (step 112). FIG. 4D is a schematic cross-sectional view of a stack 400 after the etch layer 408 is etched.

It has been found that without the post etch treatment the passage a significant amount of time passes or the exposure of the stack to an ambient environment after the pattern transfer and before etching the etch layer results in pattern collapse. Various processes have been tried to prevent pattern collapse without success. However, it was unexpectedly found that providing the proper pressure, while removing sulfur containing sidewalls prevents pattern collapse. It is believed that if the sulfur containing sidewalls are not completely removed, the sulfur containing sidewalls absorb moisture, which reacts with the sulfur to cause pattern collapse. Various embodiments either completely remove the sulfur containing sidewalls or change the sulfur containing sidewalls so that moisture is not absorbed in a manner that causes pattern collapse. Without being bound by theory, it is believed that preferably, the post etch treatment removes some of the sulfur containing sidewall and changes the remaining sulfur containing sidewalls, so that moisture is not absorbed in a manner that causes pattern collapse. Since the pattern is in a carbon based layer, the post etch treatment must not damage such a carbon based layer. Preferably, the post treatment gas is provided at a pressure of between 50 mTorr to 500 mTorr inclusive. More preferably, the post treatment gas is provided at a pressure of between 100 mTorr to 400 mTorr inclusive. Most preferably, the post treatment gas is provided at a pressure of between 150 mTorr to 300 mTorr inclusive. Without being bound by theory, it is believed that the pressure range influences the isotropic treatment of the sidewalls.

During the transferring the pattern from the patterned hardmask to the carbon based mask layer, preferably the bias is greater than 10 volts. More preferably the bias is in the range between 50 volts and 400 volts. Most preferably, the bias is in the range between 100 volts and 300 volts. During the providing the post treatment, preferably the bias is greater than 20 volts. More preferably the bias is in the range between 20 volts and 80 volts. Most preferably, the bias is in the range between 25 volts and 40 volts. The energy of ions should be enough to change or/and remove the sulfur containing layer from sidewalls, but not too high to excessively sputter layers 416 and 408.

In various embodiments, the patterned hardmask 416 is preferably silicon based, such as silicon nitride, silicon oxynitride, amorphous silicon or polysilicon. A fluorine containing dry etch may be used to transfer the pattern from the photoresist mask 420 to the patterned hardmask 416.

In various embodiments, the carbon based mask layer 412 may be comprise amorphous carbon, and therefore may be amorphous carbon, hydrogenated amorphous carbon, or spin-coat organic carbon rich material which is used as under-layer in a multilayer resist scheme. In some embodiments, an anti-reflective coating (BARC) layer may be placed below the photomask 420.

In various embodiments, the etch layer may be silicon oxide, silicon nitride, tungsten nitride, silicon, tungsten, aluminum oxide, hafnium oxide, titanium, or titanium nitride.

Preferably, the features etched in the carbon based mask layer 412 have a height to wide aspect ratio of greater than 2.5:1. Preferably, the features in the carbon based mask layer 412 have a period or pitch less than 100 nm. Preferably, the etched features in the carbon based mask layer 412 and ultimately in the etch layer 408 are etched lines or 2-dimensional array of pillars.

In various embodiments, the post treatment gas comprises at least one of He, Ar, $N_2$, $H_2$ or $NH_3$. More preferably, the post treatment gas comprises He, $H_2$, and $N_2$.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for etching features in a stack comprising a patterned hardmask over a carbon based mask layer over an etch layer, comprising:

transferring a pattern from the patterned hardmask to the carbon based mask layer, comprising:
      providing a flow of a transfer gas comprising an oxygen containing component and at least one of $SO_2$ or COS;
      forming the transfer gas into a plasma;
      providing a bias of greater than 10 volts to accelerate ions from the plasma to the carbon based mask layer, which transfers the pattern to the carbon based mask layer; and
      stopping the flow of the transfer gas; and
   providing a post treatment, comprising:
      providing a flow of a post treatment gas comprising at least one of He, Ar, $N_2$, $H_2$, or $NH_3$, wherein the flow is provided to maintain a processing pressure of between 50 mTorr and 500 mTorr inclusive;
      forming the post treatment gas into a plasma;
      providing a bias of greater than 20 volts to accelerate ions from the plasma to the carbon based mask layer; and
      stopping the flow of the post treatment gas.

2. The method, as recited in claim 1, further comprising etching the etch layer through the carbon based mask layer.

3. The method, as recited in claim 2, wherein patterned hardmask is of a silicon based material.

4. The method, as recited in claim 3, wherein the silicon based material is at least one of silicon nitride, silicon oxynitride, amorphous silicon, or polysilicon.

5. The method, as recited in claim 4, wherein the carbon based mask layer comprises amorphous carbon.

6. The method, as recited in claim 5, wherein the transferring the pattern forms a sulfur containing sidewall passivation.

7. The method, as recited in claim 6, wherein the post treatment step removes or changes the sulfur containing sidewall passivation.

8. The method, as recited in claim 7, wherein the etch layer is at least one of silicon oxide, silicon nitride, or tungsten nitride.

9. The method, as recited in claim 8, wherein the transferring the pattern from the patterned hardmask to the carbon based mask layer forms mask features in the carbon based mask, wherein the mask features are lines or 2-dimensional array of pillars.

10. The method, as recited in claim 9, wherein the mask features have a height to width aspect ratio of greater than 2.5:1.

11. The method, as recited in claim 10, wherein the mask features have a period or pitch less than 100 nm.

12. The method, as recited in claim 1, wherein patterned hardmask is of a silicon based material.

13. The method, as recited in claim 1, wherein the carbon based mask layer comprises amorphous carbon.

14. The method, as recited in claim 1, wherein the transferring the pattern forms a sulfur containing sidewall passivation.

15. The method, as recited in claim 14, wherein the post treatment step removes or changes the sulfur containing sidewall passivation.

16. The method, as recited in claim 1, wherein the transferring the pattern from the patterned hardmask to the carbon based mask layer forms mask features in the carbon based mask, wherein the mask features are lines or 2-dimensional array of pillars.

17. The method, as recited in claim 1, wherein the mask features have a height to width aspect ratio of greater than 2.5:1.

18. The method, as recited in claim 1, wherein the mask features have a period or pitch less than 100 nm.

\* \* \* \* \*